US006540312B1

(12) United States Patent
Lane

(10) Patent No.: US 6,540,312 B1
(45) Date of Patent: Apr. 1, 2003

(54) CABLE GUIDE SYSTEM

(75) Inventor: James J. Lane, Sagamore, MA (US)

(73) Assignee: Telica, Inc., Marlboro, MA (US)

( * ) Notice: Subject to any disclaimer, the term of this patent is extended or adjusted under 35 U.S.C. 154(b) by 1 day.

(21) Appl. No.: 09/790,837

(22) Filed: Feb. 22, 2001

Related U.S. Application Data

(60) Provisional application No. 60/185,006, filed on Feb. 25, 2000.

(51) Int. Cl.[7] .............................................. A47B 81/00
(52) U.S. Cl. ........................ 312/223.6; 211/26; 361/829
(58) Field of Search ........................... 312/223.6, 223.1, 312/265.1, 265.2, 265.3, 265.4, 265.5, 265.6; 108/50.01, 50.02; 361/825, 826, 829; 248/68.1, 65; 211/26, 189

(56) References Cited

U.S. PATENT DOCUMENTS

| | | | | |
|---|---|---|---|---|
| 5,657,209 A | * | 8/1997 | Batten, Jr. et al. .......... 361/796 |
| 5,709,566 A | * | 1/1998 | Tsuji et al. ................. 439/397 |
| 6,102,214 A | * | 8/2000 | Mendoza ..................... 211/26 |
| 6,345,873 B1 | * | 2/2002 | Kim ..................... 312/223.6 X |
| 6,347,714 B1 | * | 2/2002 | Fournier et al. .............. 211/26 |
| 6,386,120 B1 | * | 5/2002 | Nelson et al. ....... 312/321.5 X |

FOREIGN PATENT DOCUMENTS

| | | | |
|---|---|---|---|
| EP | 663781 | * | 7/1995 |
| JP | 10134935 | * | 5/1998 |
| WO | 9323694 | * | 6/2000 |

* cited by examiner

Primary Examiner—Lanna Mai
Assistant Examiner—Hanh V. Tran
(74) Attorney, Agent, or Firm—Hale and Dorr LLP

(57) ABSTRACT

A cable holding matrix and method for managing large numbers of telecommunications cables within a confined space. The cable holding matrix comprises a support member and two pluralities of aligned posts protruding from a surface of the support member and intersecting each other at an acute angle. The posts are spaced such that cables may be guided between two neighboring posts in the second plurality, bent around one of those neighboring posts, and positioned between two neighboring posts in the first plurality.

11 Claims, 3 Drawing Sheets

CABLE GUIDE SYSTEM

This application claims priority to U.S. provisional application No. 60/185,006 filed Feb. 25, 2000 which is expressly incorporated by reference.

FIELD OF THE INVENTION

The present invention relates to management of telecommunications cables. More specifically, the invention relates to an apparatus and method for managing large numbers of telecommunications cables within a confined space.

BACKGROUND OF THE INVENTION

Telecommunications equipment, especially, but not limited to, central office switching hardware, is becoming increasingly compact. Previous generations of such equipment typically occupied several equipment racks in a central office. Current technology collapses this equipment down to one shelf occupying one third to one half of such a rack. However, the more compact modern equipment still serves the same number of users and thus requires the same number of wires connecting the equipment to the users. The wire-carrying cables that used to be distributed among several equipment racks must now be connected to a single shelf. Managing the layout and connection of these cables within the confines of this compact chassis is increasingly a problem. Proper cable management is important to facilitate access to removable plug-in modules, insure proper ventilation air flow, and simplify growth and expansion of equipment installation.

SUMMARY OF THE INVENTION

The present invention provides a cable management system for holding and guiding telecommunications cables in the area of telecommunications equipment so that the cables dress neatly and each cable follows a specific path to its attachment point on the equipment without interfering with other cables connecting to the same equipment.

The invention provides a cable holding matrix and method of using the matrix to manage multiple optical or electrical cables. The matrix is composed of posts attached to a support member. Two pluralities of aligned posts protrude from a surface of the support member and intersect each other at an acute angle. The posts are spaced such that cables may be guided between two neighboring posts in the second plurality, bent around one of those neighboring posts, and positioned between two neighboring posts in the first plurality.

DETAILED DESCRIPTION OF THE INVENTION

Figure 1:
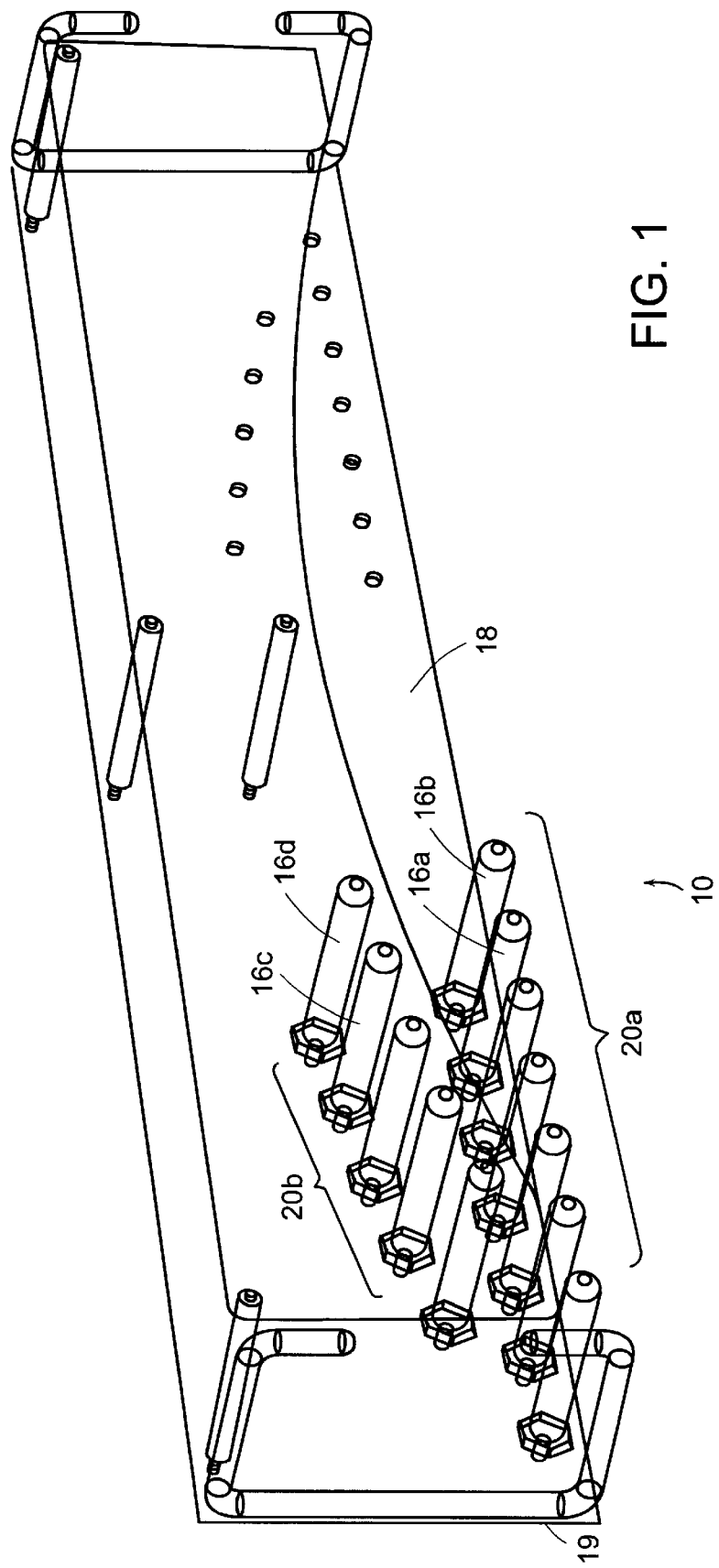
FIG. 1 is a perspective view of a cable holding matrix according to a preferred embodiment the invention.
Figure 2A:
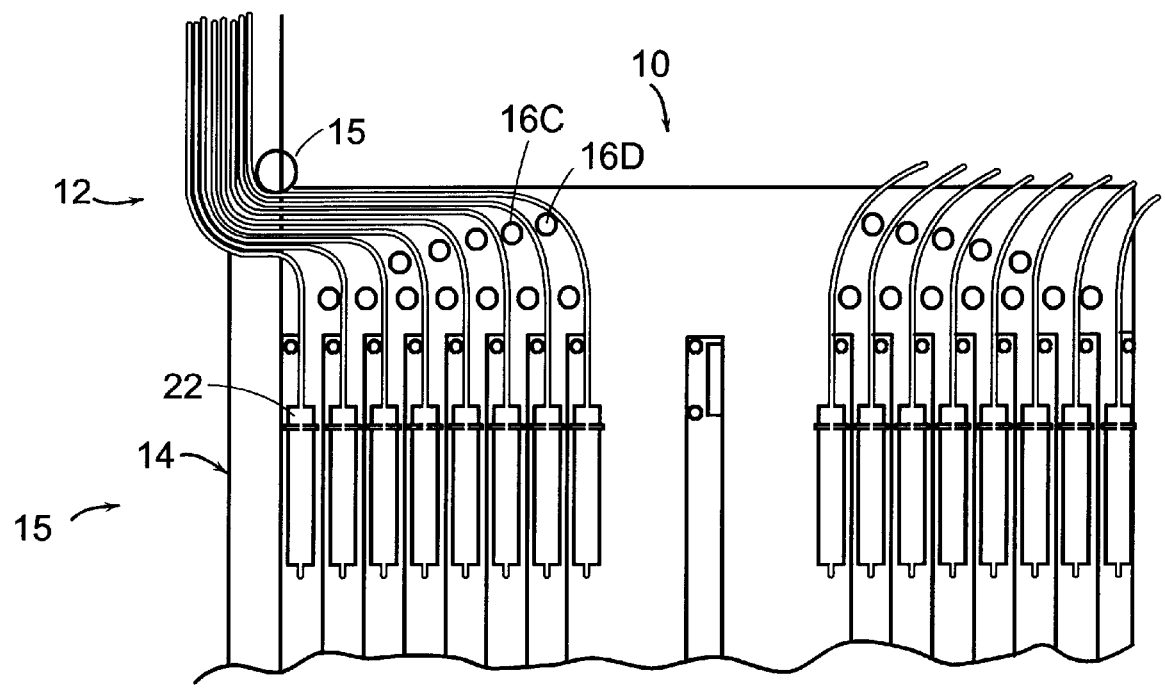
FIGS. 2A–B show the cable holding matrix mounted on a chassis according to a preferred embodiment of the invention.
Figure 2B:
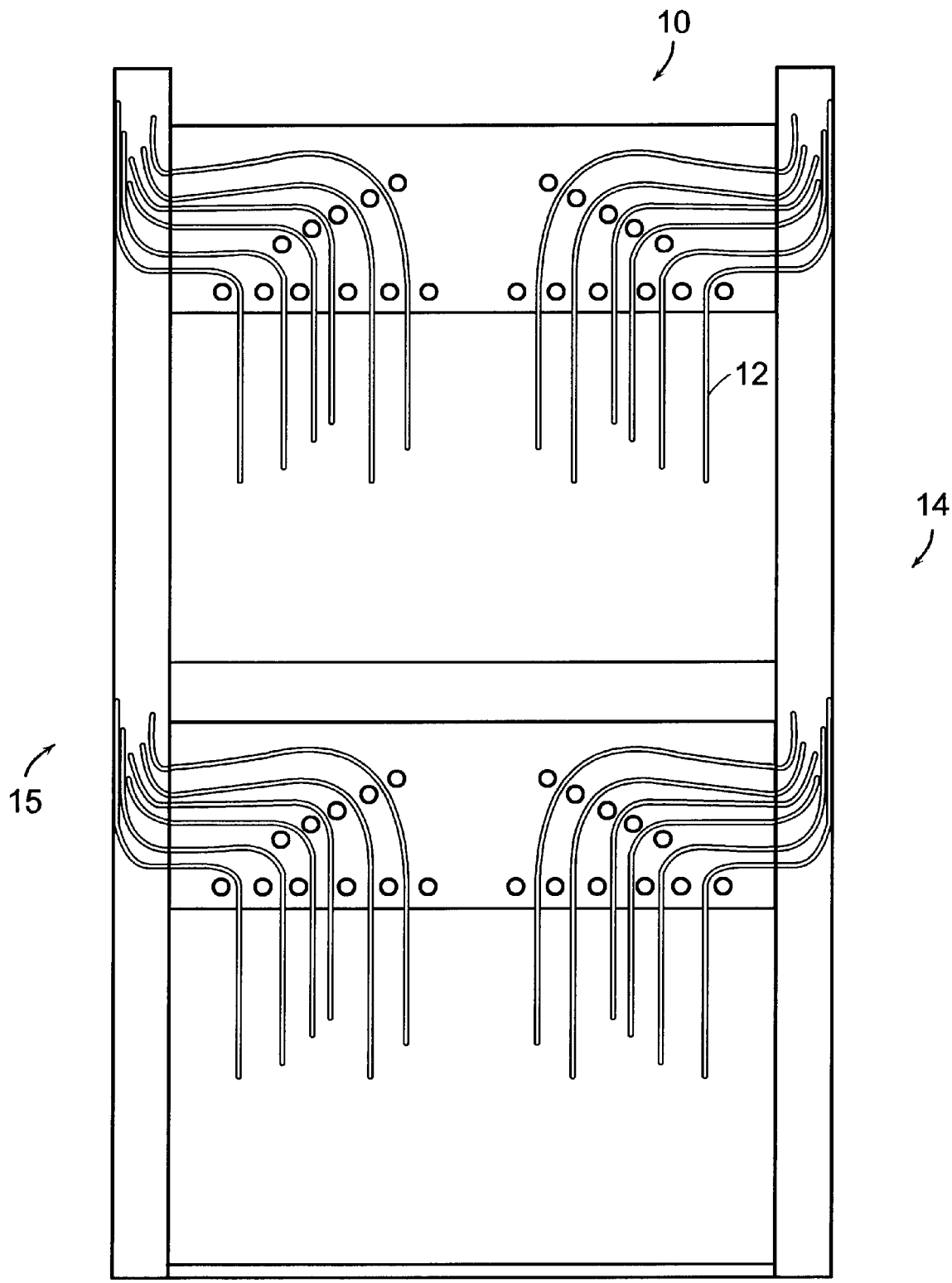

Referring to FIGS. 1 and 2A–B, a cable holding matrix 10 provides a system for organizing telecommunications cables 12 within the confines of a compact equipment chassis 14. Cables that connect a user to communications equipment consist of either many cables composed of multiple twisted pairs inside a common jacket approximately 0.5" in diameter or multiple coaxial cables each approximately 0.25" in diameter. It would not be uncommon for 30 or more of the twisted pair cables or 100 of the coaxial cables to be attached to a piece of equipment. These cables are typically routed in an overhead frame in the equipment room and are dropped vertically down beside an equipment rack holding the equipment. The invention consists of a method and apparatus for holding, dressing and guiding all of these cables from the point where they reach the equipment to the point at which they connect to the equipment.

The cable holding matrix 10 is composed of multiple posts 16 attached to a support member 18. Preferably, two sets of posts 20a,b protrude from a surface of the support member 18. A mirror version if the two sets are also preferably provided though not shown in FIG. 1 (only the post holes are shown). Each set of posts protrudes from the support member in alignment, and the alignments of the two sets of posts intersect each other. In the preferred embodiment, a horizontal row 20a of posts extends across approximately one-half the width of the support member. A second series of posts 20b intersects the horizontal row of posts at an acute angle, preferably about 15°. The posts of the second series 20b ascend in sequence from one edge 19 of the support member to about the middle of support member.

The cable holding matrix 10 may be mounted on a chassis 14, which is attached to an equipment rack that holds telecommunications equipment. FIG. 2 shows how a cable holding matrix 10 is mounted on the upper part of the chassis 14, which is attached to the equipment rack. Cables 12 entering the vicinity of the equipment are guided to their equipment attachment points by the posts 16 in the cable holding matrix 10.

In the preferred embodiment, cables 12 descend vertically from above the equipment rack and are bent into a horizontal plane by a bearing post 15 located on the equipment rack. The cables 12 then pass through a side of the chassis 14 and enter the cable holding matrix 10. Each cable 12 is guided between neighboring posts, e.g., 16c,d, in the angled row of posts, and is bent downward around one of those posts. Each cable 12 is then directed between a pair of horizontal posts, e.g., 16a,b. From this point the cables 12 will continue on to their equipment connection points 22. Successive cables are brought into the equipment using the angled row of posts to turn the cables downward and the horizontal row of posts to guide the cables to their connection points in successive plug-in module positions across the face of the equipment.

The posts 16 of the cable holding matrix 10 are long enough to accommodate multiple layers of cables. Preferably, the posts are between about 1 and 2 inches long and are made of a rigid, high density material, such as steel.

The spatial relationship between the posts 16 provides for proper dressing of the cables 12. The ascending posts 20b are positioned so that the cables 12 have an adequate bending radius and so that, after being bent around one of the ascending posts, each cable is aligned to pass between two posts in the horizontal row and directly to an equipment connection point. The posts are also spaced such that the cables 12 positioned in the matrix 10 form a layered stack and dress horizontally in a neat and secure fashion across the face of the equipment. In a preferred embodiment, the distance between neighboring posts in the horizontal row is about 1 inch. The distance between neighboring posts in the ascending row is preferably between about 1.2 inches.

A single cable holding matrix 10 may be used effectively to guide and protect cables terminating on various telecommunications equipment in an equipment rack. However, in a preferred embodiment, multiple cable holding matrices may be used in conjunction to provide a cable management system for telecommunications equipment, as shown in FIG. 2B.

While the foregoing invention has been described in some detail for purposes of clarity and understanding, it will be appreciated by one skilled in the art from a reading of this disclosure that various changes in form and detail can be made without departing from the scope of the invention and the attached claims.

What is claimed is:

1. A cable holding matrix for guiding cables, each having a proximal end with a connector, in a guided manner to prevent bending of the cable beyond a predetermined angle, comprising:

a support member;

a first plurality of posts attached to the support member and protruding from a surface of the support member in alignment;

a second plurality of posts attached to the support member and protruding from a surface of the support member in alignment, the alignment of the second plurality intersecting the alignment of the first plurality at an acute angle;

wherein adjacent posts of the second plurality are spaced such that cables may be placed and guided between two adjacent posts of the second plurality by contacting the cables with the posts at a portion of a side of the cable away from the proximal end and bent around one of the two adjacent posts to place the cable in linear alignment with a spacing between two adjacent posts of the first plurality.

2. The matrix of claim 1 wherein the posts protrude from the support member a sufficient length allowing the posts to guide a plurality of cables.

3. The matrix of claim 1 wherein the acute angle is about 30°.

4. The matrix of claim 1 wherein the first plurality of posts forms a horizontal row extending across a width of the support member.

5. The matrix of claim 1 wherein the second plurality of posts ascends in alignment from an edge of the support member to a center of the support member and then descends in alignment from the center of the support member to an opposite edge of the support member.

6. The matrix of claim 1 wherein adjacent posts in the first plurality of posts are spaced at a distance of about 1 inch; and wherein adjacent posts of the second plurality of posts are spaced at a distance of about 1.2 inches.

7. The matrix of claim 1 wherein the first and second pluralities of posts are spaced such that cables placed between adjacent posts form a layered stack across a surface of the support member.

8. A cable guiding system comprising:

an equipment rack;

a bearing post attached to the equipment rack;

a chassis attached to the equipment rack;

a cable holding matrix for guiding cables, each having a proximal end with a connector, in a guided manner to prevent bending of the cable beyond a predetermined angle, mounted on the chassis, the matrix comprising:

a support member;

a first plurality of posts attached to the support member and protruding from a surface of the support member in alignment;

a second plurality of posts attached to the support member and protruding from a surface of the support member in alignment, the alignment of the second plurality intersecting the alignment of the first plurality at an acute angle;

wherein adjacent posts of the second plurality are spaced such that cables may be placed and guided between two adjacent posts of the second plurality by contacting the cables with the posts at a portion of a side of the cable away from the proximal end and bent around one of the two adjacent posts to place the cable in linear alignment with a spacing between two adjacent posts of the first plurality;

wherein the bearing post is positioned such that cables may be bent around the bearing post and pass through a side of the chassis into the matrix.

9. The cable guiding system of claim 8, further comprising at least one additional chassis mounted to the equipment rack in alignment with the chassis, such that cables may be guided along the equipment rack by passing through the matrices of successive chassis.

10. A method of managing a plurality of optical cables in telecommunications equipment comprising:

providing a support member;

providing a first plurality of posts attached to the support member and protruding from a surface of the support member in alignment;

providing a second plurality of posts attached to the support member and protruding from a surface of the support member in alignment, the alignment of the second plurality intersecting the alignment of the first plurality at an acute angle;

placing each cable, having a proximal end with a connector, between two adjacent posts of the second plurality;

bending and guiding the cable around one of the two adjacent posts of the second plurality by contacting the cable with the post at a portion of the side of the cable away from the proximal end to place the cable in linear alignment with a spacing between two adjacent posts of the first plurality; and placing the cable between the two adjacent posts of the first plurality.

11. The method of claim 10 wherein the cables are placed between adjacent posts of the first and second pluralities such that the cables form a layered stack across a surface of the support member.

* * * * *